United States Patent
Brewel et al.

(10) Patent No.: US 11,277,921 B2
(45) Date of Patent: *Mar. 15, 2022

(54) COMPONENT PLACEMENT DEVICE

(71) Applicant: Assembléon B.V., Eindhoven (NL)

(72) Inventors: Roy Brewel, Liempde (NL); Richard Adrianus Johannes van der Burg, Eindhoven (NL); Petrus Adrianus Antonius van Hoogstraten, Oss (NL)

(73) Assignee: Assembléon B.V., Eindhoven (NL)

( * ) Notice: Subject to any disclaimer, the term of this patent is extended or adjusted under 35 U.S.C. 154(b) by 209 days.

This patent is subject to a terminal disclaimer.

(21) Appl. No.: 16/513,174

(22) Filed: Jul. 16, 2019

(65) Prior Publication Data

US 2019/0343006 A1    Nov. 7, 2019

Related U.S. Application Data

(63) Continuation of application No. 15/804,141, filed on Nov. 6, 2017, now Pat. No. 10,398,035, which is a (Continued)

(30) Foreign Application Priority Data

Oct. 7, 2014   (NL) ...................................... 2013584

(51) Int. Cl.
*B23P 19/00*    (2006.01)
*H05K 3/30*    (2006.01)
(Continued)

(52) U.S. Cl.
CPC ........... *H05K 3/30* (2013.01); *H05K 13/0408* (2013.01); *H05K 13/0409* (2018.08);
(Continued)

(58) Field of Classification Search
CPC .......... Y10S 294/907; Y10T 29/53174; Y10T 29/53178; Y10T 29/4913; Y10T 29/4978; Y10T 29/53191; Y10T 29/53091
(Continued)

(56) References Cited

U.S. PATENT DOCUMENTS

| | | |
|---|---|---|
| 4,533,167 A | 8/1985 | Johnson |
| 5,064,234 A | 11/1991 | Marozsan et al. |

(Continued)

FOREIGN PATENT DOCUMENTS

| | | |
|---|---|---|
| DE | 102011088321 | 6/2013 |
| GB | 1382444 | 1/1975 |

OTHER PUBLICATIONS

International Type Search Report and Written Opinion dated Jun. 2, 2015 for Netherlands Patent Application No. NL 2013584.

*Primary Examiner* — Thiem D Phan
(74) *Attorney, Agent, or Firm* — Christopher M. Spletzer, Sr.

(57) ABSTRACT

A component placement device for picking up a component and placing a component on a substrate device comprises a holder which is movable at least in a main direction, as well as a nozzle for picking up a component. The nozzle is movable at least in a direction opposite the main direction relative to the holder. The component placement device comprises a fluid flow channel which opens or closes upon movement of the nozzle in the direction opposite the main direction relative to the holder, detection means for detecting the opening or closing of the fluid flow channel as well as means for controlling the movement of the holder in at least the main direction on the basis of a signal delivered by the detection means concerning the opening or closing of the fluid flow channel.

19 Claims, 4 Drawing Sheets

Related U.S. Application Data continuation of application No. 14/843,889, filed on Sep. 2, 2015, now Pat. No. 9,814,144.

(51) Int. Cl.
*H05K 13/08* (2006.01)
*H05K 13/04* (2006.01)

(52) U.S. Cl.
CPC .......... *H05K 13/08* (2013.01); *Y10T 29/4913* (2015.01); *Y10T 29/53174* (2015.01)

(58) Field of Classification Search
USPC .......... 29/739, 740, 743, 832, 836, 890.142
See application file for complete search history.

(56) References Cited

U.S. PATENT DOCUMENTS

| | | |
|---|---|---|
| 5,131,139 A | 7/1992 | Oyama et al. |
| 5,308,132 A | 5/1994 | Kirby et al. |
| 5,420,488 A | 5/1995 | Gutman |
| 5,422,554 A | 6/1995 | Rohde |
| 7,426,781 B2 * | 9/2008 | Burger ............... H05K 13/0409 29/740 |
| 8,550,523 B2 * | 10/2013 | Rachkov ............ H05K 13/0413 294/183 |

* cited by examiner

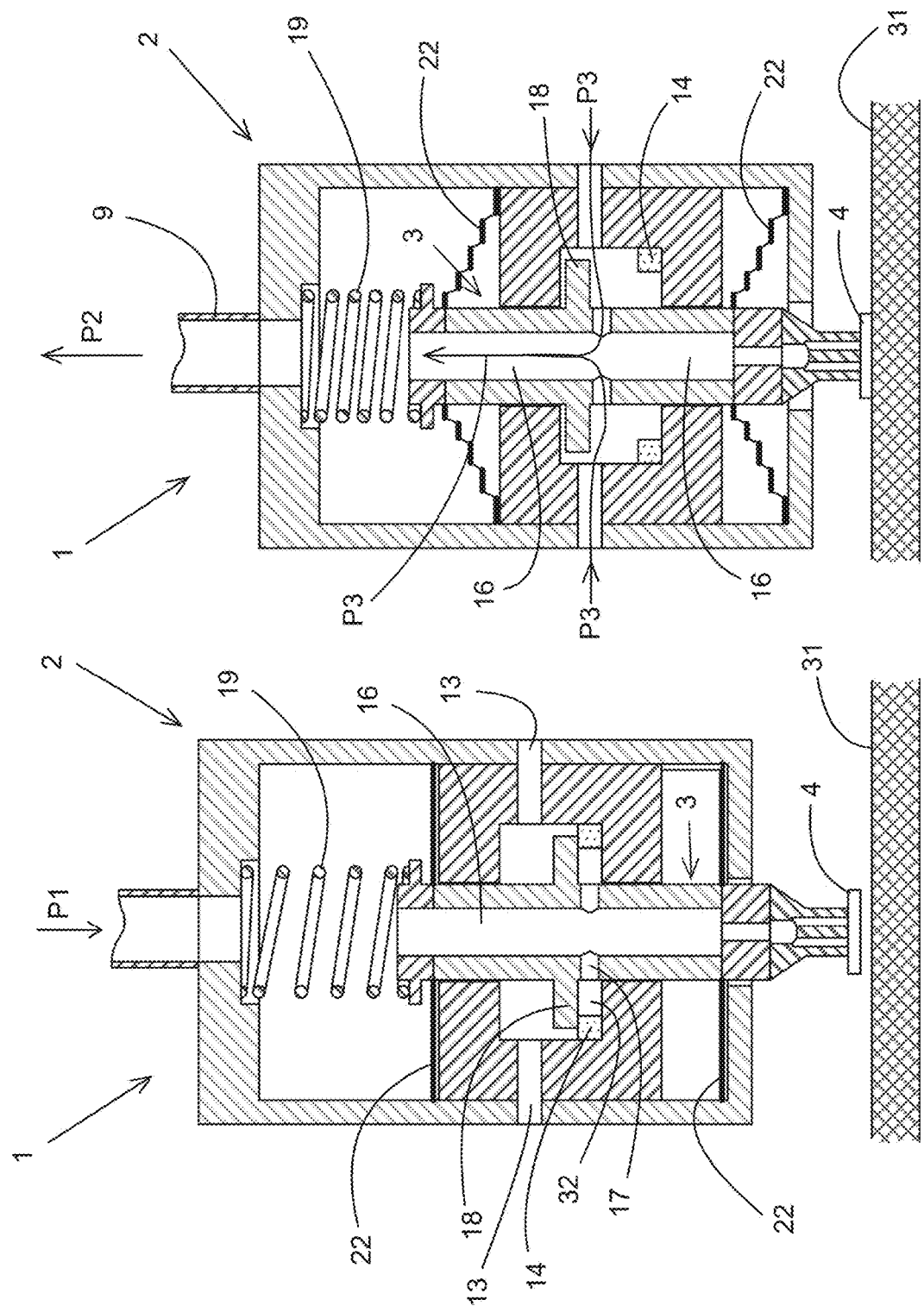

COMPONENT PLACEMENT DEVICE

CROSS-REFERENCE TO RELATED APPLICATIONS

This application is a continuation of U.S. patent application Ser. No. 15/804,141, filed on Nov. 6, 2017, which is a continuation of U.S. patent application Ser. No. 14/843,889, filed Sep. 2, 2015, now U.S. Pat. No. 9,814,144, which claims the benefit of Dutch Patent Application No. 2013584, filed Oct. 7, 2014, the contents of which are incorporated herein by reference.

FIELD OF THE INVENTION

The invention relates to a component placement device for picking up a component and placing a component on a substrate, which component placement device comprises a holder which is movable at least in a main direction, as well as a nozzle for picking up a component, which nozzle is movable relative to the holder at least in a direction opposite to the main direction.

The invention also relates to a method for picking up a component and placing a component on a substrate using such a component placement device.

BACKGROUND OF THE INVENTION

Such component placement devices are known per se, they are used for, inter alia, picking up electronic components from a component supplying device, moving the component to a desired position above a substrate and placing the component at the desired position on the substrate. The picking up of the component takes place by means of a nozzle, which is for example connected to a vacuum source for creating a partial vacuum in the nozzle. To ensure that the component is picked up correctly, the nozzle must be moved into contact with the outer surface of the component. For this purpose the holder is moved in the main direction, and once the nozzle comes into contact with the component, the nozzle is moved against spring force in a direction opposite the main direction relative to the holder. The object of this relative movement is to prevent damage to the nozzle and/or to the component. In a similar manner, the holder is moved in the main direction upon placement of the component on the substrate, with the nozzle and the component being moved in a direction opposite the main direction relative to the holder once the component carried by the nozzle comes into contact with the substrate.

Usually the holder is moved a predetermined distance in the main direction. However, if components of the same type have different thicknesses, for example due to manufacturing tolerances, if the substrate is irregular in thickness or partially warped, the movement of the nozzle relative to the holder will not be constant, nor will the spring force exerted on the component be constant. Thus there is a risk that the force exerted on the component will be too great, which may lead to damage to the component. Furthermore it is possible that the component will not touch the substrate at all at the moment when the component is released, in which case the force exerted on the component will be too small. When the component is placed in soldering compound or dots of adhesive, the component must be pressed into said compound or adhesive with sufficient force. With the existing component placement devices there is a risk that the force will be too small, as a consequence of which the component will not be pressed into the soldering compound or dots of adhesive with sufficient force.

SUMMARY OF THE INVENTION

The object of the invention is to provide a component placement device by means of which a component can be picked up and placed in a precise manner whilst preventing undesirable forces being exerted on the component.

This object is achieved in the component placement device according to the invention in that the nozzle is provided with a passage connected to a vacuum source and to at least one opening of a component pick-up part, which nozzle is also provided with an opening in a wall of the nozzle located between the vacuum source and the at least one opening, which opening is in open communication with the passage, wherein the holder is provided with a channel which is in communication with the opening and the passage via a closable connection, wherein a fluid flow channel comprising at least part of the passage, the opening and the channel is being opened or closed by the nozzle at the closable connection upon movement of the nozzle relative to the holder in the direction opposite to the main direction, the component placement device further comprises detection means for detecting the opening or closing of the fluid flow channel as well as means for controlling the movement of the holder in at least the main direction on the basis of a signal delivered by the detection means concerning the opening or closing of the fluid flow channel.

Once the nozzle is moved in the direction opposite the main direction relative to the holder, the fluid flow channel will be opened, for example, and flow of fluid will take place through the fluid flow channel. This flow of fluid is detected by detection means. The detection means may comprise a pressure sensor or a flow sensor, for example, by means of which a change in the flow of fluid is detected. The detection means further comprise a microprocessor, for example, by means of which it is detected, on the basis of a signal delivered by the sensor, that the fluid flow channel is open and the nozzle is being moved in the direction opposite the main direction relative to the holder. Subsequently, using the means for controlling the movement of the holder in the main direction, the movement of the holder in the main direction is stopped, continued over a predetermined distance or continued otherwise. In this way it is no longer of importance for the correct and precise picking up or placement of the component that the thickness of the component and/or height variation of the substrate be known in advance or be constant.

When the fluid flow channel is closed upon movement of the nozzle in the direction opposite the main direction relative to the holder, flow of fluid through the fluid flow channel will be interrupted, which will be detected by the sensor. Subsequently the movement of the holder in the main direction will be controlled on the basis of the signal delivered by the sensor.

The fluid may be air, another type of gas or a liquid.

In the case of a closed closable connection, a partial vacuum prevails in the passage through the vacuum source, whilst the pressure in the channel will be ambient pressure. By opening the closable connection, the passage is placed in open communication with the channel in the holder via the opening, as a result of which flow of fluid will take place from the channel to the passage and the pressure in the passage will increase. The change in the pressure or the fluid flow can be detected by means of a sensor.

In the case of an open closable connection, a partial vacuum will prevail in the passage through the vacuum source, and flow of fluid will take place from the channel to the passage via the opening. Once the closable connection is closed, the pressure in the passage will fall, the flow of fluid in the passage will change and the flow of fluid through the channel will decrease. The change in the pressure or the flow of fluid can be detected by means of a sensor.

One embodiment of the component placement device according to the invention is characterised in that the fluid flow channel will open upon movement of the nozzle in the direction opposite the main direction relative to the holder.

In this embodiment, flow of fluid only takes place during movement of the nozzle in the direction opposite the main direction relative to the holder, so that the amount of fluid needed for detecting movement of the nozzle relative to the holder is limited.

A further embodiment of the component placement device according to the invention is characterised in that the passage extends through a component pickup part of the nozzle, wherein the fluid flow resistance of the passage in the component pickup part is greater than the joint fluid flow resistance of the opening in the wall of the nozzle and the channel in the holder.

As a result, fluid will readily flow through the opening in the wall of the nozzle and the channel in the holder upon opening or closing of the closable connection, which flow of fluid and the pressure change caused thereby can be easily detected by means of a sensor.

This is important in particular upon taking up the component, when a partial vacuum is already created in the passage prior to the contact between the nozzle and a component, wherein, due to the greater fluid flow resistance, only a small amount of fluid will flow into the passage through the passage in the component pickup part.

Another embodiment of the component placement device according to the invention is characterised in that the nozzle is movable against spring force in the direction opposite the main direction relative to the holder.

Upon placement of the component, the nozzle can move against spring force relative to the holder, as a result of which the spring force will also be exerted between the component and the substrate. In this way the component is pressed against the substrate with a predetermined force upon being placed.

As a result of the spring force, the nozzle is pressed in the main direction to a fixed starting position relative to the holder upon movement of the component placement device from a component pickup position to the position above the substrate, in which starting position the fluid flow channel is closed or open.

Another embodiment of the component placement device according to the invention is characterised in that the nozzle is connected to the holder by means of two leaf springs.

Using such leaf springs, a precise guidance for moving the nozzle in the main direction and in the opposite direction relative to the holder can be realised in a simple manner.

The invention also relates to a method for picking up a component and placing a component on a substrate using a component placement device as described in the foregoing.

The object of the invention is to provide a method by means of which a component can be picked up and placed in a precise manner whilst preventing undesirable forces being exerted on the component.

This object is achieved with the method according to the invention in that the nozzle is provided with a passage connected to a vacuum source and to at least one opening of a component pick-up part, which nozzle is also provided with an opening in a wall of the nozzle located between the vacuum source and the at least one opening, which opening) is in open communication with the passage, wherein the holder is provided with a channel which is in communication with the opening and the passage via a closable connection, wherein a fluid flow channel comprising at least part of the passage, the opening and the channel is being opened or closed by the nozzle at the closable connection upon movement of the nozzle relative to the holder in the direction opposite the main direction, wherein the holder is moved in the main direction, in the direction of the component upon picking up of the component or in the direction of the substrate upon placement of the component on the substrate, until the nozzle comes into contact with the component upon picking up the component or until the component comes into contact with the substrate) upon placement of the component, after which, upon further movement of the holder in the main direction, the nozzle is moved relative to the holder in the direction opposite to the main direction, wherein the fluid flow channel of the component placement device is opened or closed, which opening or closing is detected by detection means, after which further movement of the holder in at least the main direction is controlled on the basis of a signal delivered by the detection means regarding the opening or closing of the fluid flow channel.

Once the nozzle is moved in the direction opposite the main direction relative to the holder, the fluid flow channel will be opened or closed, and flow of fluid will take place through the fluid flow channel or the flow of fluid will be interrupted, as the case may be. The flow of fluid or the resulting pressure change will be detected by the detection means, which determine that the nozzle is being moved in the direction opposite the main direction relative to the holder. The movement of the holder in the main direction is then stopped, continued over a predetermined distance or continued otherwise. In this way it is no longer of importance for the correct and precise picking up or placement of the component that the thickness of the component and/or the exact height of the substrate be known in advance or be constant. Furthermore, the moment of contact between the nozzle and the component upon picking up the component and the moment of contact between the component and a substrate upon placement of the component on the substrate can be quickly and precisely determined in this way.

One embodiment of the method according to the invention is characterised in that the further movement of the holder in the main direction is stopped on the basis of a signal delivered by the detection means regarding the opening or closing of the fluid flow channel.

As a result, the picking up and/or placement of the component can take place with minimal force.

Another embodiment of the method according to the invention is characterised in that the holder is moved a predetermined distance in the main direction on the basis of a signal delivered by the detection means regarding the opening or closing of the fluid flow channel.

In this way the component can be picked up and/or placed in a controlled manner with a predetermined force.

Another embodiment of the method according to the invention is characterised in that the fluid flow channel is opened upon movement of the nozzle in the direction opposite the main direction relative to the holder.

Flow of fluid will only take place upon movement of the nozzle in the direction opposite the main direction relative to the holder, so that the amount of fluid needed for detecting movement of the nozzle relative to the holder is limited.

BRIEF DESCRIPTION OF THE DRAWINGS

The invention will now be explained in more detail with reference to the drawing, in which:

FIG. 2 is a view of the component placement device of FIG. 1A while the component is being moved to a desired position on a substrate;

FIG. 3 is a view of the component placement device of FIG. 1A during the placement of the component at a desired position on a substrate;

Like parts are indicated by the same numerals in the figures.

DESCRIPTION OF THE DRAWINGS

Figure 1A:
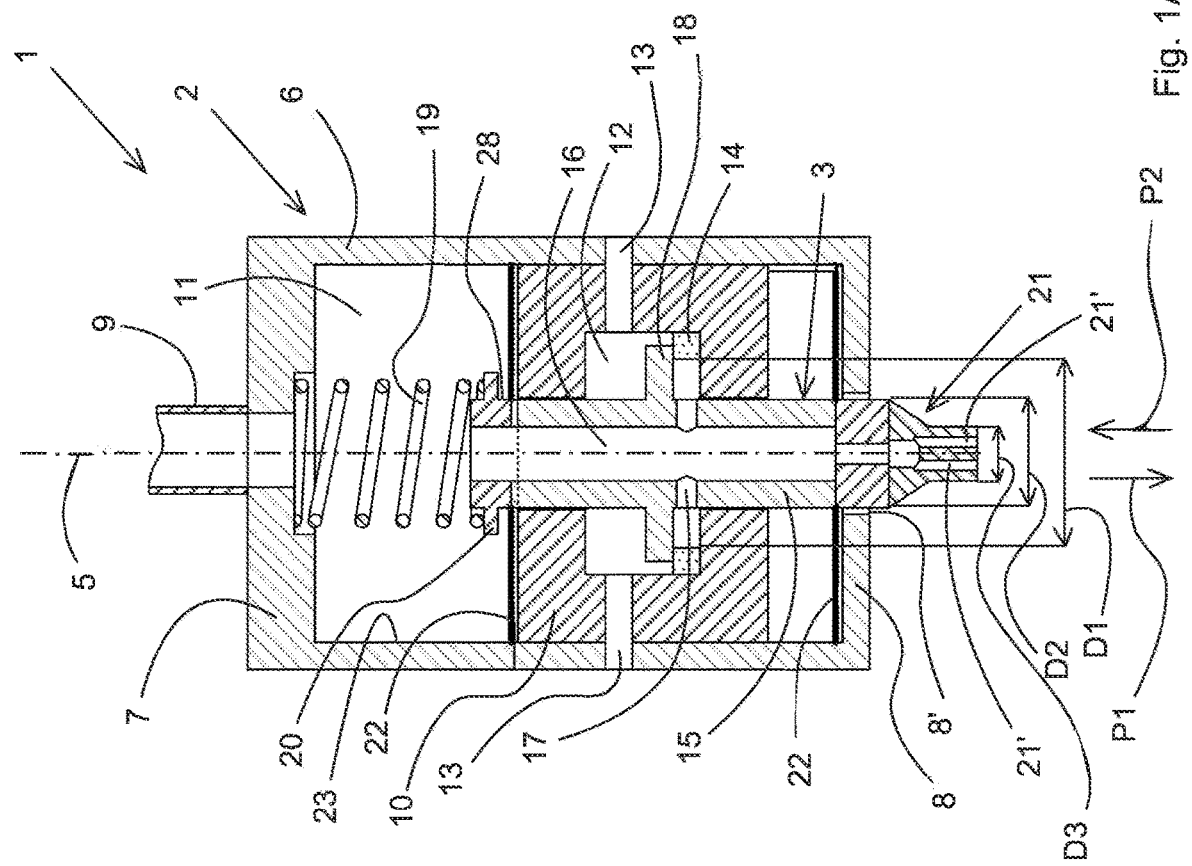
FIGS. 1A and 1B are a cross-sectional view and a detail view, respectively, of a first embodiment of a component placement device according to the invention.
Figure 1B:
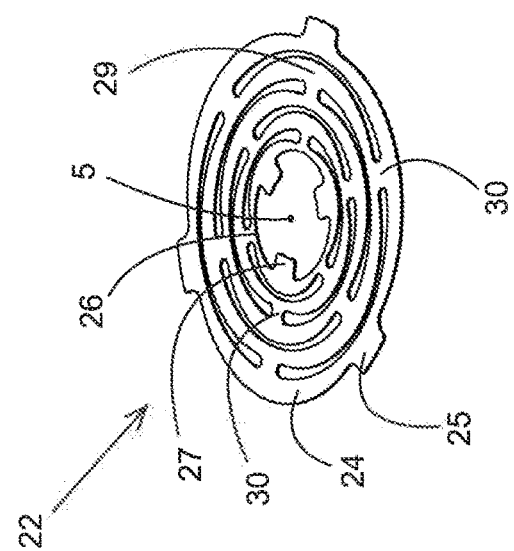

FIGS. 1A and 1B show a cross-sectional view and a detail view, respectively, of a component placement device 1 according to the invention. The component placement device comprises a holder 2, which is movable at least in a main direction indicated by arrow P1, and also a nozzle 3 for picking up a component 4. The nozzle 3 is movable relative to the holder 2 at least in a direction opposite the main direction, as indicated by the arrow P2. The directions indicated by the arrows P1, P2 extend parallel to a central axis 5.

The holder 2 has a cylindrical housing 6, which is closed at an upper side and a bottom side by an upper wall 7 and a lower wall 8, respectively. The holder 2 is provided with a pipe 9 in the upper wall 7 of the holder 2, which pipe 9 is connected to a vacuum source (not shown). The lower wall 8 is provided with an opening 8', through which the nozzle 3 extends. The cylindrical housing 6 accommodates a cylindrical element 10, through which the nozzle 3 extends. The cylindrical housing 6, the upper wall 7 and the cylindrical element 10 define a vacuum chamber 11. The cylindrical element 10 comprises a cylindrical chamber 12, which is in open communication with the environment via a number of channels 13 that extend transversely to the central axis 5 and through the cylindrical housing 6. Accordingly, normal ambient pressure prevails in the cylindrical chamber 12. A sealing ring 14 having an inner diameter D1 is provided in the cylindrical chamber 12, on a side near the lower wall 8. The inner diameter D1 is for example 5-10 mm, for example 7 mm.

The nozzle 3 comprises a tube 15 extending along the central axis 5, which defines a passage 16. The tube 15 has an outer diameter D2. The outer diameter D2 is for example 3-8 mm, for example 5 mm. Provided in a wall of the tube 15 are a number of openings 17, which open into the cylindrical chamber 12. In the cylindrical chamber 12, the tube 15 is provided with an external flange 18.

At the upper side, the passage 16 opens into the vacuum chamber 11. Near the upper side, the tube 15 is provided with an external flange 20. A biased spring 19 is provided between the flange 20 and the upper wall 7, which spring urges the nozzle 3 in the direction indicated by the arrow P1, causing the external flange 18 to be pressed against the sealing ring 14. The diameters D1 and D2 are preferably such that D2*D2 approximately equals D1*D1−D2*D2, so that the forces acting on the flange 18 and the nozzle 3 as a result of the partial vacuum and the ambient pressure substantially cancel out one another.

Near the bottom side, the tube 15 is provided with a component pickup part 21, which is provided with one or more narrow passages 21', which are connected to the passage 16 and which are in open communication with the environment. The component pickup part 21 has an outer diameter D3 on a side remote from the tube 15. The outer diameter D3 depends on the size of the component to be picked up; in practice it will often range between the 0.1 and 3 mm.

The nozzle 3 is connected to an inner wall 23 of the cylindrical housing 6 of the holder 2 by means of two leaf springs 22. The leaf springs 22 are provided below the flange 20 in the vacuum chamber 11 and below the cylindrical element 10 near the lower wall 8.

As shown in FIG. 1B, the leaf spring 22 comprises an outer ring 24, which is provided with three projections 25, which are connected to the inner wall 23 of the cylindrical housing 6 of the holder 2. The leaf spring 22 further comprises an inner ring 26, which is provided with three projections 27, which are connected to the outer wall 28 of the tube 15 of the nozzle 3. Located between the outer ring 24 and the inner ring 26 are a number of rings 29, which are connected to adjacent rings 24, 26, 29 via bridge segments 30. The pair of leaf springs 22 forms a good linear guide for the nozzle 3 in relation to the holder 2.

FIG. 2 shows the component placement device 1 while the component 4 is being moved, by driving means known per se (not shown), to a desired position on a substrate 31. As a result of the partial vacuum created in the passages 16, 21' by means of the vacuum source via the vacuum line 9, a component 4 is held by the component pickup part 21. The component 4 has for example been picked up from a component supplying device that is known per se. While the component placement device 1 is being moved from the component supplying device near the desired position on the substrate 31, the nozzle 3 is pressed in the main direction indicated by the arrow P1 by the spring 19, causing the external flange 18 to be pressed against the sealing ring 14. The openings 17 open into a space 32 enclosed by the cylindrical element 10, the flange 18 and the sealing ring 14, so that the fluid connection between the passage 16 and the channels 13 is closed. Once the component 4 is present above the desired position on the substrate 31, the component placement device 1 will be moved in the main direction indicated by the arrow P1.

At some point the component 4 will touch the substrate 31, as a result of which the component 4 and the nozzle will no longer be moved in the main direction indicated by the arrow P1. The holder 2, on the other hand, will move further against spring force in the main direction indicated by the arrow P1, so that the nozzle 3 will be moved in a direction opposite the main direction relative to the holder 2, as indicated by the arrow P2. See FIG. 3. The flange 18 is moved away from the sealing ring 14, so that simultaneously an open fluid connection through the channels 13, the chamber 12, the openings 17 and the passage 16 is formed. The channels 13, the chamber 12, the openings 17 and the passage 16 form the fluid flow channel. As a result of this open fluid connection in the fluid flow channel, flow of fluid to the vacuum source will be started through the pipe 9 in the direction indicated by the arrows P3. In this pipe 9 a sensor 33 (schematically indicated in FIG. 4) is provided, by means of which the pressure or flow of the fluid, such as air, can be detected both in the case of a closed fluid connection (FIG. 2) and in the case of an open fluid connection (FIG. 3). The joint fluid flow resistance of the passages 21' in the component pickup part 21 is greater than the joint fluid flow resistance of the openings 17 in the nozzle 3 and the channels 13 in the holder 2, so that a change of the pressure or flow of the fluid can be detected relatively quickly.

Subsequently, further movement of the holder 2 in the main direction indicated by the arrow P1 is controlled on the basis of the signal delivered by the sensor 33.

The press-on force acting on the component 4 in FIG. 3 depends on the spring characteristic of the spring 19 and the relative movement of the nozzle 3 relative to the holder 2. The relative movement is in the order of 1 mm, for example 0.3 mm.

Figure 4:
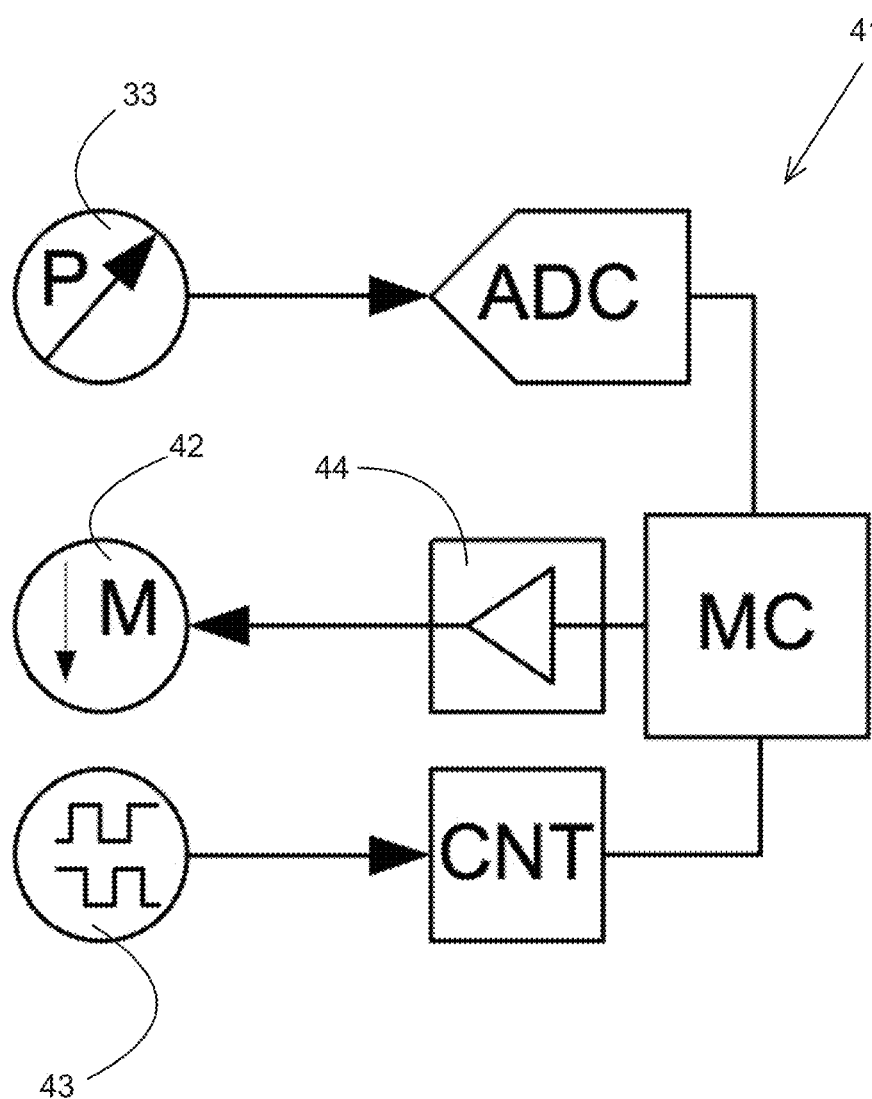
FIG. 4 is a schematic diagram for controlling the movement of the holder of the component placement device shown in FIG. 1A.

FIG. 4 shows a schematic diagram of a control circuit 41 for controlling the movement of the holder 2 of the component placement device 1. The control circuit 41 comprises the sensor 33, a motor 42 for moving the holder 2 in the directions indicated by the arrows P1, P2, a position sensor 43 for determining the number of steps by which the holder 2 has been moved in the direction indicated by the arrows P1, P2, an AD converter ADC connected to the sensor 33 for converting the signal delivered by the sensor 33 into a digital signal, a microprocessor MC, a counter CNT connected to the position sensor 43 for determining the number of steps by which the holder 2 has been moved in the directions indicated by the arrows P1, P2. The control circuit 41 further comprises a unit 44 connected between the microprocessor MC and the motor 42 for driving the motor 42. The AD converter ADC converts the signal delivered by the sensor 33 and feeds it to the microprocessor MC. Furthermore, the signal from the position sensor 43 is fed to the microprocessor MC by the counter CNT. Based on the signal received from the AD converter ADC, the microprocessor MC determines whether the nozzle 3 is being moved in the direction indicated by the arrow P2 relative to the holder, and also the manner in which the holder 2 is subsequently to be moved. The movement of the holder 2 can be stopped, continued in the direction indicated by the arrow P1 or be continued in the direction indicated by the arrow P2. The microprocessor MC subsequently delivers a signal to the motor 42, via the unit 44, for moving the holder 2 in the desired manner. The control circuit 41 comprises the detection means for detecting the opening or closing of the fluid flow channel and the means for controlling the movement of the holder in at least the main direction.

Figures 5A, 5B:
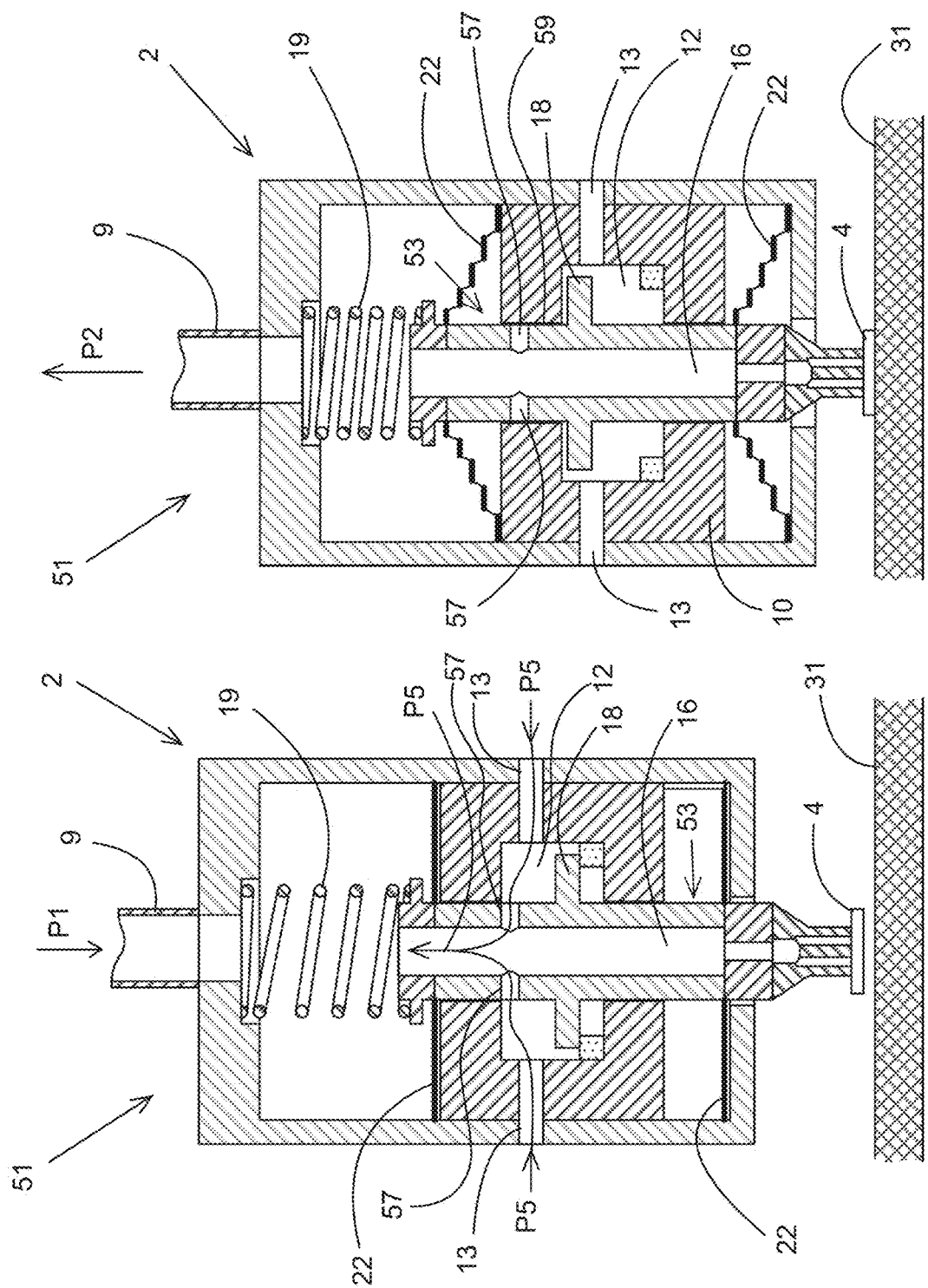
FIGS. 5A and 5B are views of a second embodiment of a component placement device according to the invention while the component is being moved to a desired position on a substrate and while the component is being placed at a desired position on a substrate, respectively.

FIGS. 5A and 5B are views of a second embodiment of a component placement device 51 according to the invention while the component is being moved 4 to a desired position on a substrate 31 and while the component 4 is being placed at a desired position on a substrate 31, respectively. The component placement device 51 in large measure corresponds to the component placement device 1. The essential difference is that the nozzle 53 is provided with openings 57, which, in the extended position of the nozzle 53 relative to the holder 2 shown in FIG. 5A, are located near the upper side of the cylindrical chamber 12. The openings 57 are in open communication with the channels 13. The channels 13, the chamber 12, the openings 57 and the passage 16 form the fluid flow channel. As a result of this open fluid connection in the fluid flow channel, flow of fluid to the vacuum source will be started through the pipe 9 in the direction indicated by the arrows P5.

Once the component 4 touches the substrate 31 upon placement of the component 4 on the substrate 31, the nozzle 53 will be moved in the direction indicated by the arrow P2 relative to the holder 2 against the spring force of the spring 19. At the same time, the openings 57 in the cylindrical element 10 will come to be located in the cylindrical element 10 and flow of fluid through the openings 57 will be reduced or be stopped altogether by the cylindrical wall 59 of the cylindrical element 10 opposite the openings 57. The fluid connection is now considered to be closed. A sensor is provided in the pipe 9, by means of which sensor the pressure or flow of the fluid, such as air, can be detected both in the case of an open fluid connection (FIG. 5A) and in the case of a closed fluid connection (FIG. 5B).

In a similar manner as in the situation in which a component 4 is placed on a substrate 31, it is possible to determine the moment of contact between the nozzle 3, 53 and the component 4 upon picking up a component 4 from a component pickup position by moving the nozzle 3, 53 relative to the holder 2, the attendant opening or closing of a fluid connection and the detection of a change in the pressure or the flow of fluid.

It is also possible to provide a precise linear guidance other than through the use of leaf springs 22.

Instead of being cylindrical in shape, the housing 6 and the element 10 may also have a rectangular or other shape.

It is also possible that the joint fluid flow resistance of the passages 21' in the component pickup part 21 is smaller than the joint fluid flow resistance of the openings 17 in the nozzle 3 and the channels 13 in the holder 2. The difference between the joint fluid flow resistance of the passages 21' in the component pickup part 21 and the joint fluid flow resistance of the openings 17 in the nozzle 3 and the channels 13 in the holder 2 must be large enough, so that the pressure difference or the difference in fluid flow that occurs when a nozzle does not carry a component, when a component is being picked up and when the nozzle is moved in the holder makes it possible to distinguish the different situations from each other.

It is also possible that the opening or closing of the fluid flow channel will not take place until the nozzle has been moved a predetermined distance relative to the holder.

In the case of a relatively long movement of the nozzle relative to the holder it is also possible to successively open or close more channels, so that different changes in pressure of fluid flow will occur. These changes will be detected by the detection means, from which detection the movement of and/or the force on the nozzle can subsequently be derived.

LIST OF REFERENCE NUMERALS 1 component placement device
2 holder
3 nozzle
4 component
5 central axis
6 housing
7 upper wall
8 lower wall
9 pipe
10 element
11 vacuum chamber
12 chamber
13 channel
14 sealing ring
15 tube
16 passage 17 opening
18 flange
19 spring
20 flange
21 component pickup part
21' passage
22 leaf spring
23 inner wall
24 outer ring
25 projection
26 inner ring
27 projection
28 outer wall
29 ring
30 bridge segment
31 substrate
32 space
33 sensor
41 control circuit
42 motor
43 position sensor
44 unit
51 component placement device
53 nozzle
57 opening
59 wall
ADC AD converter
CNT counter
D1 inner diameter
D2 inner diameter
MC micro-processor
P1 arrow
P2 arrow
P3 arrow
P5 arrow

What is claimed:

1. A component placement device for placing a component on a substrate, the component placement device comprising:
a holder movable in a main direction;
a nozzle for picking up a component, the nozzle being movable relative to the holder in a direction opposite the main direction, the nozzle being provided with a passage connected to a vacuum source and to at least one opening of a component pickup part, the nozzle being provided with an opening in a wall of the nozzle located between the vacuum source and the at least one opening, the opening being in communication with the passage, the holder being provided with a channel in communication with the opening and the passage via a closable connection; and
a detector for detecting opening or closing of a fluid flow channel of the component placement device at the closable connection.

2. The component placement device of claim 1 wherein the fluid flow channel includes at least part of the passage, the opening in the wall of the nozzle, and the channel, the fluid flow channel being configured to be opened or closed by the nozzle at the closable connection upon movement of the nozzle relative to the holder in the direction opposite the main direction.

3. The component placement device of claim 2 further comprising a control circuit for controlling movement of the holder in the main direction on the basis of a signal delivered by the detector concerning the opening or closing of the fluid flow channel.

4. The component placement device of claim 1 wherein the fluid flow channel will open upon movement of the nozzle in the direction opposite the main direction relative to the holder.

5. The component placement device of claim 1 wherein the passage extends through the component pickup part.

6. The component placement device of claim 5 wherein a fluid flow resistance of the passage in the component pickup part is greater than a joint fluid flow resistance of the opening in the wall of the nozzle and the channel in the holder.

7. The component placement device of claim 1 wherein the nozzle is movable against a spring force in the direction opposite the main direction.

8. The component placement device of claim 1 wherein the nozzle is connected to the holder by means of two leaf springs.

9. The component placement device of claim 8 wherein the nozzle is further connected to the holder by a biased spring.

10. The component placement device of claim 1 wherein the detector includes a pressure sensor.

11. The component placement device of claim 1 wherein the detector includes a flow sensor.

12. The component placement device of claim 1 wherein the closable connection includes a sealing ring.

13. The component placement device of claim 12 wherein the passage is defined by a tube which has an outer diameter and the sealing ring has an inner diameter.

14. The component placement device of claim 1 wherein the holder defines a housing.

15. The component placement device of claim 14 wherein the housing is cylindrical.

16. The component placement device of claim 1 wherein the passage is connected to the vacuum source by a pipe.

17. The component placement device of claim 1 wherein the passage is defined by a tube.

18. The component placement device of claim 17 wherein the tube has an outer diameter ranging from three to eight millimeters.

19. The component placement device of claim 18 wherein the outer diameter is five millimeters.

* * * * *